(12) United States Patent
Park

(10) Patent No.: US 7,629,245 B2
(45) Date of Patent: Dec. 8, 2009

(54) METHOD OF FORMING NON-VOLATILE MEMORY DEVICE

(75) Inventor: Kyoung Hwan Park, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 149 days.

(21) Appl. No.: 11/749,242

(22) Filed: May 16, 2007

(65) Prior Publication Data

US 2008/0081418 A1    Apr. 3, 2008

(30) Foreign Application Priority Data

Sep. 29, 2006   (KR) ............... 10-2006-0096114

(51) Int. Cl.
*H01L 21/3205* (2006.01)
*H01L 21/4763* (2006.01)
*H01L 21/302* (2006.01)
*H01L 21/3213* (2006.01)
*H01L 21/336* (2006.01)

(52) U.S. Cl. ............... 438/594; 438/751; 257/E21.305; 257/E21.429

(58) Field of Classification Search ............... 438/232, 438/745, 749–751, 756–757; 257/E21.214–E21.215, 257/E21.305, E21.429
See application file for complete search history.

(56) References Cited

U.S. PATENT DOCUMENTS

| | | | | |
|---|---|---|---|---|
| 5,677,222 A | * | 10/1997 | Tseng | 438/253 |
| 5,686,332 A | * | 11/1997 | Hong | 438/261 |
| 5,880,008 A | * | 3/1999 | Akiyama et al. | 438/444 |
| 6,429,108 B1 | * | 8/2002 | Chang et al. | 438/587 |
| 2005/0037623 A1 | * | 2/2005 | Hsieh et al. | 438/706 |

FOREIGN PATENT DOCUMENTS

| | | |
|---|---|---|
| KR | 10-1999-0057081 | 7/1999 |
| KR | 10-0244292 | 11/1999 |

* cited by examiner

*Primary Examiner*—Savitri Mulpuri
*Assistant Examiner*—Calvin Choi
(74) *Attorney, Agent, or Firm*—Marshall, Gerstein & Borun LLP

(57) ABSTRACT

A method of fabricating a non-volatile memory device, wherein a gate insulating layer, a first conductive layer, a tunneling layer, a trap nitride layer, a blocking oxide layer, and a capping layer are sequentially formed over a semiconductor substrate of a peripheral region. A contact region of the capping layer is etched. A spacer is formed on sidewalls of the capping layer. A contact region of the blocking oxide layer is etched by using the spacer as a mask. The spacer is removed while etching a contact region of the trap nitride layer. A contact region of the tunneling layer is etched.

7 Claims, 4 Drawing Sheets

METHOD OF FORMING NON-VOLATILE MEMORY DEVICE

CROSS-REFERENCE TO RELATED APPLICATION

The priority benefit of Korean patent application number 10-2006-96114, filed on Sep. 29, 2006, which is incorporated by reference in its entirety, is claimed.

BACKGROUND OF THE INVENTION

The invention relates, in general, to non-volatile memory devices and, more particularly, to a method of fabricating a non-volatile memory device, in which it can solve problems of a contact etch process for fabricating transistors of a peripheral region.

A non-volatile memory device is a memory device having the property of maintaining data although the supply of power is stopped. The non-volatile memory device includes a charge trap layer in which charges are trapped between the gate of a transistor and a channel in order to implement the difference of threshold voltage (Vth) of the channel. The threshold voltage is varied depending on a state where charges are injected into the charge trap layer, that is, a program state or an erase state where electrons are discharged. An operation of a device is implemented by employing the concept in which the threshold voltage is varied by charges trapped or stored in the charge trap layer as described above.

In a typical flash memory device, a floating gate employing a metal layer or a polysilicon layer has been used as the charge trap layer. Thus, the non-volatile memory device stores information in such a manner that electrons, which have passed through the tunneling layer by applying high voltage to the gate upon program (Pgm), are trapped at a trap site of the floating gate, that is, the charge trap layer. At time of an erase operation for erasing the information stored as described above, the electrons trapped at the floating gate are extracted toward the substrate by means of the Fowler-Nordheim (FN) tunneling method by applying a negative gate voltage −Vg to the gate or grounding the gate, and applying high voltage to the substrate. Meanwhile, recently, research has been done into a flash memory device of a Silicon-Oxide-Nitride-Oxide Silicon (SONOS) structure in which the floating gate is formed from a nitride layer not a metal layer or a polysilicon layer.

However, the flow of unnecessary electrons occurs in a flash memory cell of the SONOS structure at the time of the erase operation. In the concrete, at the time of the program operation, high voltage is applied to the control gate. In this case, there occurs a back tunneling phenomenon in which the electrons of the control gate are injected into the floating gate through the dielectric layer. The back tunneling phenomenon hinders electrons from being completely discharged from the floating gate at the time of the erase operation, degrading an erase characteristic.

In recent years, in order to solve the problem that the erase characteristic is degraded due to the back tunneling phenomenon, an oxide layer formed from high dielectric (h-k) material, such as $Al_2O_3$, $HfO_2$, or $ZrO_2$, as the blocking oxide layer, is formed between the control gate and the nitride layer used as the floating gate. Such an oxide layer mitigates an electric field to prevent the back tunneling phenomenon of electrons.

However, in the peripheral region, a gate oxide layer/a first polysilicon layer/a tunneling layer/a trap nitride layer/a blocking oxide layer/a second polysilicon layer have a lamination structure. In order to form a transistor, the oxide layer and the nitride layer between the first polysilicon layer and the second polysilicon layer must be etched in order to electrically connect the first polysilicon layer and the second polysilicon layer.

However, in the case where the blocking oxide layer is formed from high dielectric material, such as $Al_2O_3$, $HfO_2$, or $ZrO_2$, it is difficult to etch the blocking oxide layer formed from the high dielectric material by means of the existing dry etch process. Due to this, a contact hole is not formed up to the tunneling layer in a desired fashion. In the worst case, the first polysilicon layer and the second polysilicon layer are not connected, resulting in failure.

To solve the problem that the blocking oxide layer formed from the high dielectric material is not etched, a wet etch process has been introduced instead of the dry etch process. However, the blocking oxide layer formed from the high dielectric material is well etched by the wet etch process, but is isotropically etched at the time of the wet etch process. Thus, the blocking oxide layer, the trap nitride layer and the tunneling layer are over etched, causing loss. It reduces process margin and increases the size of the transistor.

SUMMARY OF THE INVENTION

Accordingly, the invention addresses the problems described above, and provides a method of forming a non-volatile memory device, in which problems of an ONO contact etch process for fabricating transistors of a peripheral region in a non-volatile memory device having a SONOS structure using high dielectric material as a blocking oxide layer can be solved.

According to one aspect, the invention provides a method of forming a non-volatile memory device, including the steps of sequentially forming a gate insulating layer, a first conductive layer, a tunneling layer, a trap nitride layer, a blocking oxide layer and a capping layer over a semiconductor substrate of a peripheral region, etching a contact region of the capping layer, forming a spacer on sidewalls of the capping layer, etching a contact region of the blocking oxide layer by using the spacer as a mask, removing the spacer while etching a contact region of the trap nitride layer, and etching a contact region of the tunneling layer.

DESCRIPTION OF SPECIFIC EMBODIMENTS

A specific embodiment according to the invention is described below with reference to the accompanying drawings.

FIGS. 1A to 1G are cross-sectional views illustrating a process of forming an ONO contact of a peripheral region in a non-volatile memory device having a SONOS structure according to an embodiment of the invention.

Figure 1A:
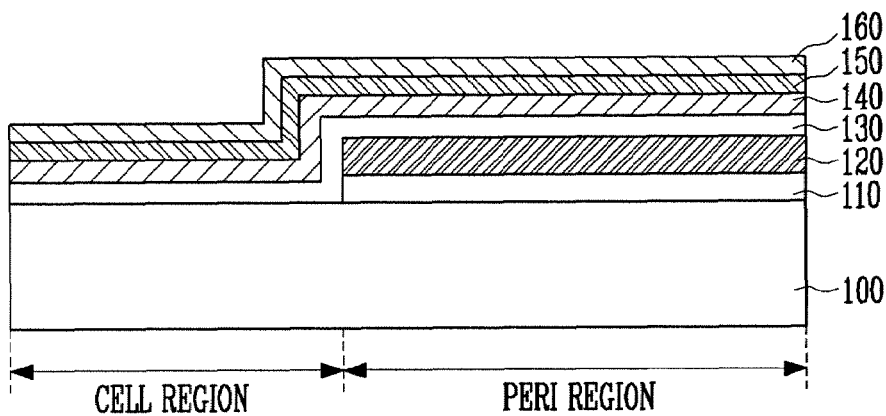
FIGS. 1A to 1G are cross-sectional views illustrating a process of forming an ONO contact of a peripheral region in a non-volatile memory device having a SONOS structure according to an embodiment of the invention.

Referring to FIG. 1A, a gate insulating layer 110 is formed in a peripheral region on a semiconductor substrate 100 including a cell region and the peripheral region. The gate insulating layer 110 can be formed from silicon oxide ($SiO_2$) by means of an oxidation process.

A first conductive layer 120 is formed on the gate insulating layer 110. The first conductive layer 120 serves to prevent the gate insulating layer 110 from being damaged at the time of a subsequent ONO contact etch process of the peripheral region. In order to use the first conductive layer 120 as a contact plug through a subsequent process, the first conductive layer 120 can be formed from a polysilicon layer or a metal layer, or a lamination layer of them. The first conductive layer 120 can be formed from a polysilicon layer having good adhesion force with the substrate.

The first conductive layer 120 can be formed by means of a Chemical Vapor Deposition (CVD) method or a Physical Vapor Deposition (PVD) method, preferably a Low Pressure CVD (LPCVD) method.

In more detail, the first conductive layer 120 and the gate insulating layer 110 can be formed by forming an insulating layer (not illustrated) and a conductive layer (not illustrated) over the semiconductor substrate 100, coating the peripheral region with a mask (not illustrated) to open the cell region, and then removing the insulating layer and the conductive layer of the cell region.

A tunneling layer 130, a trap nitride layer 140, a blocking oxide layer 150, and a capping layer 160 are sequentially formed in the cell region and the peripheral region on the semiconductor substrate 100 including the second conductive layer 120.

The tunneling layer 130 can be formed using silicon oxide ($SiO_2$) by means of an oxidation process. The trap nitride layer 140 can be formed using nitride-based material (hereinafter, referred to as "nitride layer"), such as silicon nitride ($Si_xN_y$) or silicon oxynitride (SiON), by means of a CVD method.

The blocking oxide layer 150 can be formed from high dielectric material, preferably one of $Al_2O_3$, $HfO_2$, and $ZrO_2$ in order to prevent the back tunneling phenomenon of electrons. Accordingly, the ONO structure of the tunneling layer 130, the trap nitride layer 140 and the blocking oxide layer 150 is completed.

Furthermore, the capping layer 160 serves to prevent the blocking oxide layer 150 from being damaged at the time of a subsequent ONO contact etch process of the peripheral region. The capping layer 160 can be formed using polysilicon by means of a CVD method, such as a LPCVD method.

Figure 1B:
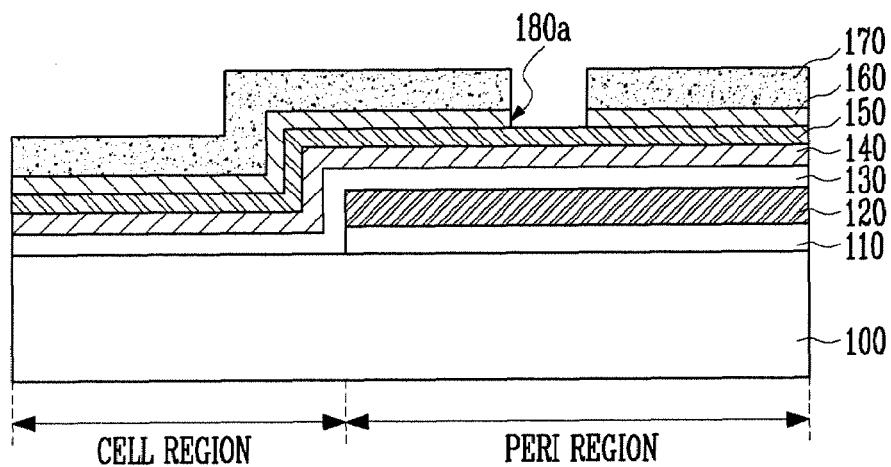

Referring to FIG. 1B, the capping layer 160 of the peripheral region is etched to a contact region by means of a dry etch process employing the mask 170. Thus, a first anisotropic contact hole 180a through which a portion of the surface of the blocking oxide layer 150 is exposed is formed in the capping layer 160. The mask 170 is removed.

Figure 1C:
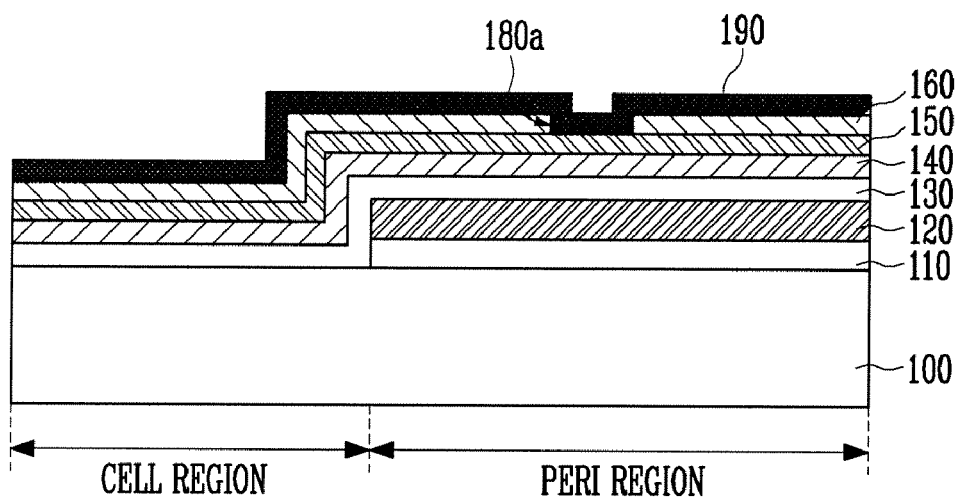

Referring to FIG. 1C, an insulating layer 190 for spacer is formed in the cell region and the peripheral region over the capping layer 160 including the first contact hole 180a. The insulating layer 190 for spacer can be formed from material with a different etch selectivity from that of the capping layer 160, preferably silicon nitride ($Si_xN_y$) or silicon oxynitride (SiON). The insulating layer 190 for spacer 190a can be formed by means of a CVD method, such as a LPCVD method.

Figure 1D:
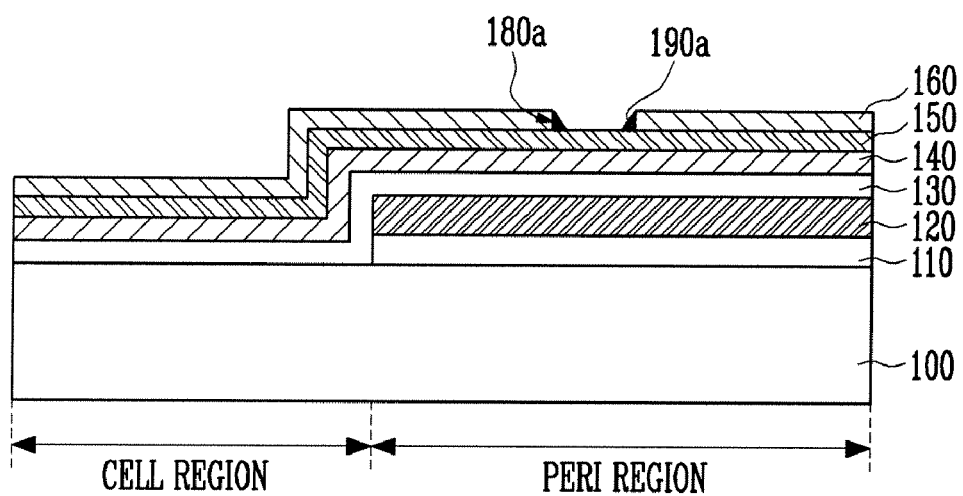

Referring to FIG. 1D, the insulating layer 190 for spacer is etched by means of a dry etch process, forming a spacer 190a on the sidewalls of the capping layer 160. In this case, the spacer 190a formed on the sidewalls of the capping layer 160 remains since a vertical thickness of the insulating layer 190 for spacer 190a is relatively thicker than a horizontal thickness of the insulating layer 190 for spacer 190a.

Figure 1E:
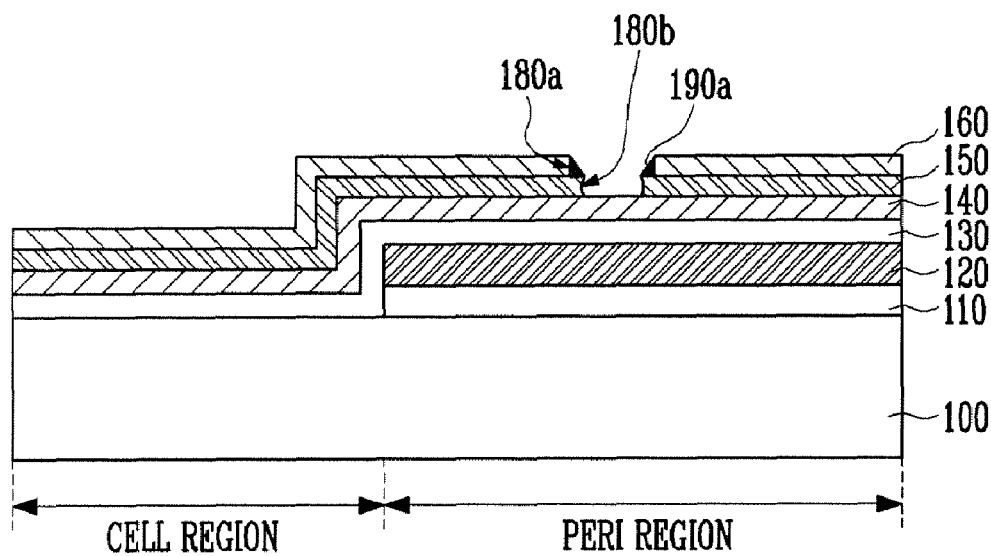

Referring to FIG. 1E, the blocking oxide layer 150 of the peripheral region is etched to a contact region by means of a wet etch process using the spacer 190a as a mask. A second isotropic contact hole 180b through which a portion of the surface of the trap nitride layer 140 is exposed is formed within the blocking oxide layer 150 below the spacer 190a.

Preferably, the blocking oxide layer 150 is etched by a wet etch process employing a Buffered Oxide Etchant (BOE) solution. Meanwhile, the spacer 190a, the blocking oxide layer 150 and the capping layer 160 are formed using material having a different etch selectivity. As the blocking oxide layer 150 of a portion in which the spacer 190a is not formed is selectively etched, the second contact hole 180b is formed smaller than the first contact hole 180a as much as the width of the spacer 190a.

Figure 1F:
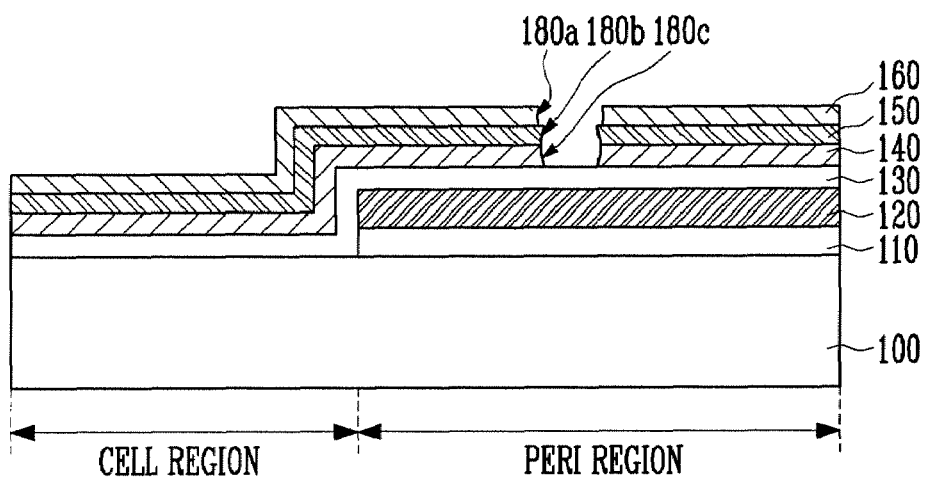

Referring to FIG. 1F, the trap nitride layer 140 of the peripheral region is etched to a contact region by means of a wet etch process. The trap nitride layer 140 can be etched using a phosphoric acid ($H_3PO_4$) solution. Thus, a third isotropic contact hole 180c through which a portion of the surface of the tunneling layer 130 is exposed is formed within the trap nitride layer 140.

Meanwhile, in the process of etching the trap nitride layer 140 by using the phosphoric acid solution, the spacer 190a formed from the nitride layer is also removed and the blocking oxide layer 150 is also etched to a contact region. Accordingly, the sizes of the first contact hole 180a and the second contact hole 180b are expanded, and the size of the third contact hole 180c becomes the same as that of the second contact hole 180b.

Figure 1G:
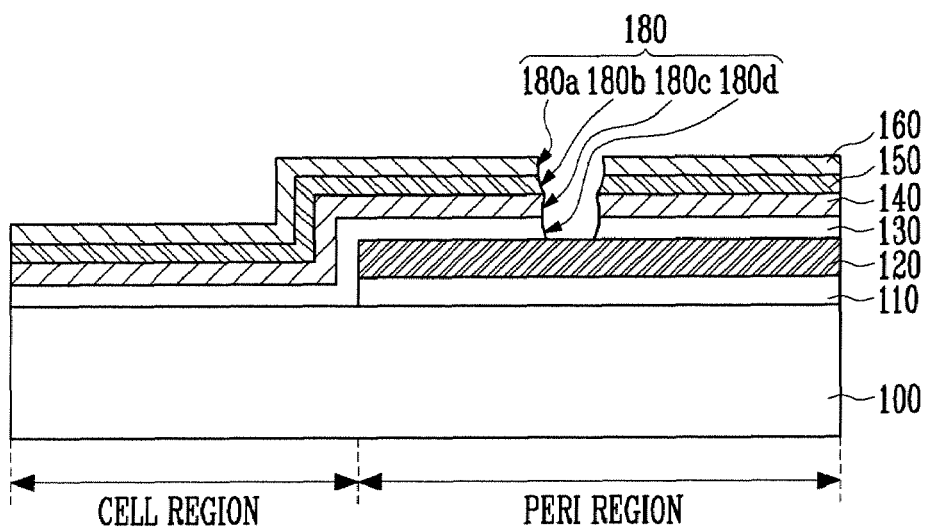

Referring to FIG. 1G, the tunneling layer 130 is etched to a contact region by means of a wet etch process. The tunneling layer 130 can be etched by means of a wet etch process employing a BOE solution. Accordingly, a fourth isotropic contact hole 180d through which a portion of the surface of the first conductive layer 120 is exposed is formed within the tunneling layer 130.

Meanwhile, at the time of the etch process of the tunneling layer 130, the blocking oxide layer 150 having the same etch selectivity as that of the tunneling layer 130 is partially etched, so that the size of the second contact hole 180b is expanded.

Thereby, the ONO contact formation process for fabricating the transistor of the peripheral region in the non-volatile memory device of the SONOS structure is completed by forming the contact hole 180 including the first, second, third, and fourth contact holes 180a, 180b, 180c, and 180d.

As described above, in the invention, after the spacer 190a is formed on the sidewalls of the capping layer 160, the blocking oxide layer 150 formed from high dielectric material can be completely etched by means of a wet etch process using the spacer 190a as a mask. It is therefore possible to completely form the contact hole 180 in the peripheral region.

Therefore, the contact plug, which is electrically connected to the first conductive layer 120 stably, can be formed by filling the contact hole 180 formed on the exposed first conductive layer 120 with polysilicon, etc. Accordingly, the performance of the transistor can be improved.

Furthermore, the spacer 190a is formed on the sidewalls of the capping layer 160. Thus, the size of the second contact hole 180b, which is initially formed when the blocking oxide layer 150 is etched, is formed small. Accordingly, although the trap nitride layer 140 and the tunneling layer 130 are anisotropically etched in a subsequent process an overall size of the contact hole 180 can be reduced. Therefore, the profile of the contact hole 180 can be improved, margin at the time of a mask process can be secured, and the size of a transistor can be reduced.

As described above, according to the invention, in a non-volatile memory device of a SONOS structure using high dielectric material as a dielectric layer, a spacer is formed on the sidewalls of a capping layer of a peripheral region. Thus, a blocking oxide layer formed from the high dielectric material can be fully etched by means of a wet etch process using the spacer as a mask. Accordingly, at the time of an ONO contact etch process, a complete contact hole can be formed, and a lower conductive layer and an upper conductive layer can be electrically connected to a contact plug. Therefore, the performance of a transistor can be improved.

Furthermore, according to the invention, the profile of a contact hole can be improved, margin at the time of a mask process can be secured, and the size of a transistor can be reduced.

Although the foregoing description has been made with reference to the various embodiments, changes and modifications of the invention may be made by one having ordinary skill in the art without departing from the spirit and scope of the invention.

What is claimed is:

1. A method of forming a non-volatile memory device, comprising the steps of:

forming a gate insulating layer, a first conductive layer, a tunneling layer, a trap nitride layer, a blocking oxide layer, and a capping layer over a semiconductor substrate of a peripheral region;

forming a first contact hole in the capping layer by etching a contact region of the capping layer;

forming a spacer on sidewalls of the first contact hole;

forming a second contact hole in the blocking oxide layer by etching the blocking oxide layer using the spacer and the capping layer as a mask;

forming a third contact hole in the trap nitride layer by simultaneously etching to remove portions of the trap nitride layer and the blocking oxide layer, and to remove the spacer using the capping layer as a mask, wherein a size of the third contact hole becomes the same as the size of the second contact hole; and forming a fourth contact hole to expose the first conductive layer by etching the tunneling layer and the blocking oxide layer using the capping layer as a mask, thereby forming a contact hole including the first, second, third, and fourth contact holes.

2. The method of claim 1, comprising forming the spacer from material having a different etch selectivity from that of the blocking oxide layer and the capping layer.

3. The method of claim 1, comprising forming the spacer from an insulating layer.

4. The method of claim 3, comprising forming the spacer from a silicon nitride ($Si_xN_y$) layer or a silicon oxynitride (SiON) layer.

5. The method of claim 1, comprising etching the blocking oxide layer and the tunneling layer by a wet etch process using a Buffered Oxide Etchant (BOE) solution.

6. The method of claim 1, comprising etching the trap nitride layer by wet etch process employing phosphoric acid ($H_3PO_4$).

7. The method of claim 1, comprising forming the capping layer from a polysilicon layer.

* * * * *